United States Patent
Sadakata (10) Patent No.: US 6,501,701 B2
(45) Date of Patent: Dec. 31, 2002

(54) SEMICONDUCTOR MEMORY DEVICE

(75) Inventor: Hiroyuki Sadakata, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/880,797

(22) Filed: Jun. 15, 2001

(65) Prior Publication Data

US 2001/0053106 A1 Dec. 20, 2001

(30) Foreign Application Priority Data

Jun. 16, 2000 (JP) ........................................ 2000-182030

(51) Int. Cl.[7] .................................................. G11C 8/00
(52) U.S. Cl. .............. 365/230.05; 365/222; 365/189.01
(58) Field of Search ............................ 365/230.05, 196, 365/207, 191, 222, 189.01

(56) References Cited

U.S. PATENT DOCUMENTS

| | | | |
|---|---|---|---|
| 5,659,515 A | 8/1997 | Matsuo et al. | |
| 6,134,169 A | 10/2000 | Tanaka | |
| 6,205,071 B1 * | 3/2001 | Ooishi | 365/205 |
| 6,256,221 B1 * | 7/2001 | Holland et al. | 365/149 |
| 6,282,606 B1 * | 8/2001 | Holland | 365/189.04 |

\* cited by examiner

*Primary Examiner*—David Nelms
*Assistant Examiner*—Thong Le
(74) *Attorney, Agent, or Firm*—McDermott, Will & Emery (57) ABSTRACT

A semiconductor memory device includes memory array, first and second rows of sense amplifiers and selector. The memory array has first and second ports. The first and second rows of sense amplifiers are associated with the first and second ports, respectively. Responsive to a port selection signal, the selector selects the first or second port, through which burst data should be transferred, and couples the first or second row of sense amplifiers, associated with the port selected, to a data input or output circuit. If the selector has selected the first port, the device performs a refresh operation on the array using the second row of sense amplifiers while transferring the burst data through the first port. If the selector has selected the second port, the device performs the refresh operation on the array using the first row of sense amplifiers while transferring the burst data through the second port.

8 Claims, 6 Drawing Sheets

SEMICONDUCTOR MEMORY DEVICE

BACKGROUND OF THE INVENTION

The present invention relates to a semiconductor memory device.

Figure 2:
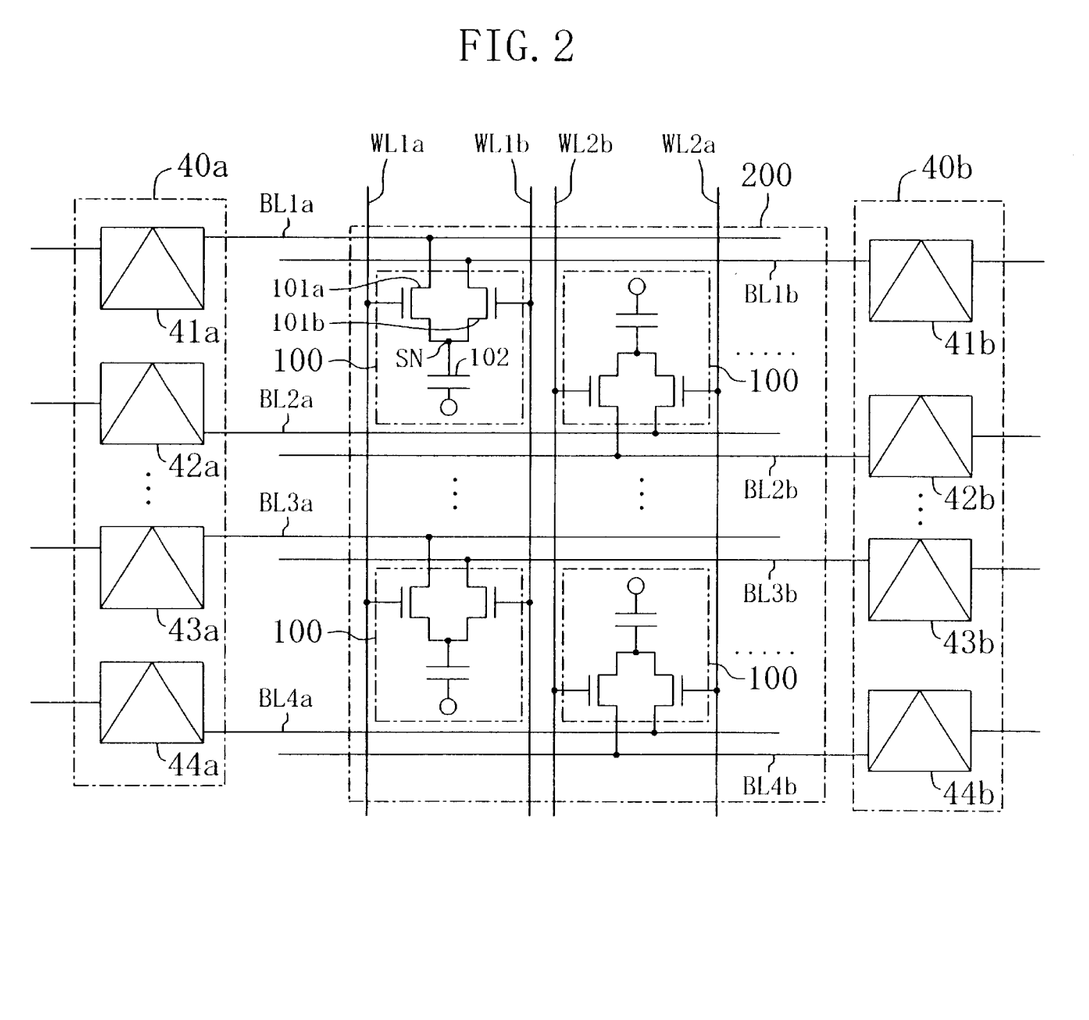
FIG. 2 is a circuit diagram illustrating a memory array and its peripheral circuits for the memory device shown in FIG. 1.

FIG. 2 is a circuit diagram illustrating an array 200 of dynamic random-access memory (DRAM) cells 100, each including two transistors 110a and 101b and one capacitor 102, and its peripheral circuits for a known semiconductor memory device. In each of the memory cells 100 shown in FIG. 2, the first transistor 110a has its gate, drain and source connected to first word line WL1a, first bit line BL1a and storage node SN, respectively. The second transistor 101b has its gate, drain and source connected to second word line WL1b, second bit line BL1b and storage node SN, respectively. One of the two electrodes of the capacitor 102 is connected to the storage node SN, while the other electrode thereof is used as a cell plate.

Thus, each memory cell 100 includes two transistors 101a and 101b that are independently controllable with respect to one capacitor 102. Accordingly, the same memory cell 100 can be accessed through two different ports, i.e., a port including the first word line WL1a, first transistor 101a and first bit line BL1a and a port including the second word line WL1b, second transistor 101b and second bit line BL1b. In other words, a memory cell 100 of this type realizes interleaved access.

A memory cell 100 of this type will be herein called a "2Tr1C memory cell". Also, the port accessing a memory cell 100 by way of the first transistor 101a will be herein called an "A-port" while the port accessing the same memory cell 100 by way of the second transistor 101b will be herein called a "B-port".

A synchronous DRAM (SDRAM) using normal memory cells, each including one transistor and one capacitor, has multiple banks and can transfer input or output data continuously by performing an interleaved operation between or among those banks. However, where multiple memory cells belonging to the same bank should be accessed successively, the SDRAM needs a precharge/equalize interval. Accordingly, the transfer of data should be stopped for this interval.

On the other hand, a semiconductor memory device including the 2Tr1C memory cells 100 performs a burst mode operation using one of the two ports while the other port is in standby mode. Accordingly, the device can perform a precharge operation using the latter port. In addition, if a command is input in view of the length of burst data and the latency of data transferred, then the device can consecutively input or output data to/from even multiple memory cells belonging to the same bank.

Figure 6:
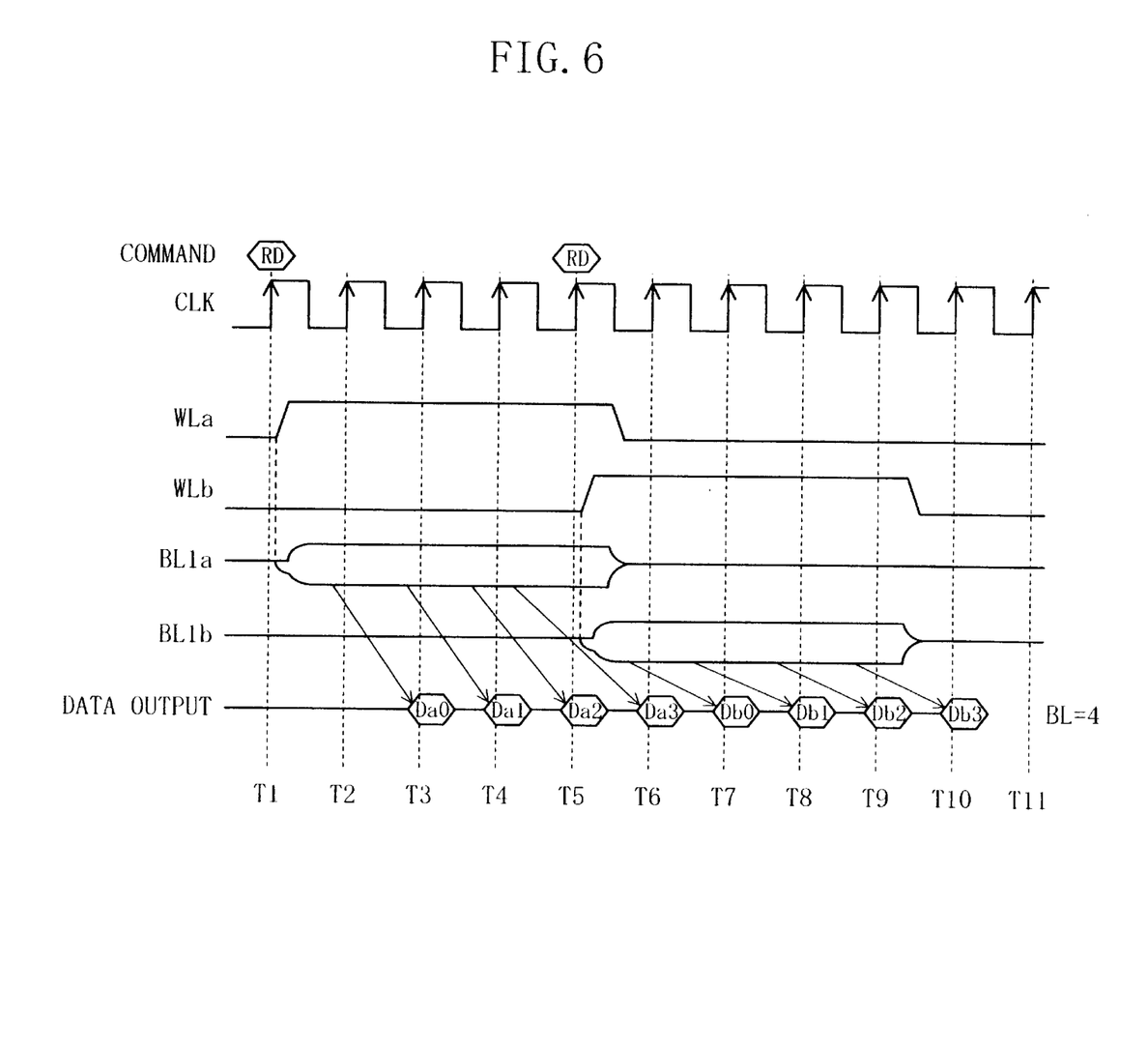
FIG. 6 is a timing diagram illustrating how a known semiconductor memory device including 2Tr1C memory cells reads burst data.

FIG. 6 is a timing diagram illustrating how the semiconductor memory device including the 2Tr1C memory cells 100 reads out burst data. Suppose this memory device inputs addresses by a non-multiplexer method and has a latency of 2, a random-access cycle number of 4 and a burst length of 4. In the example illustrated in FIG. 6, the first and second types of word lines activated are identified by WLa and WLb, respectively.

As shown in FIG. 6, a read command RD is input at a time T1. In response, the first word line WL1a, for example, is activated and data is read out through the A-port including the first bit lines BL1a, BL3a, BL5a and so on. As a result, data bits Da0 through Da3 are output consecutively between times T3 and T7.

At a time T5 when a next command can be input, a read command RD is input again. In response, the second word line WL1b, for example, is activated and data is read out through the B-port including the second bit lines BL1b, BL3b, BL5b and so on. As a result, data bits Db0 through Db3 are output consecutively between times T7 and T11.

The second bit lines BL1b and so on, included in the B-port, are precharged and equalized while the data is read out through the A-port. Accordingly, as soon as the burst data has been read out through the A-port, the data can be read out through the B-port. In this manner, data can be transferred continuously.

Thus, while the memory device is precharging using one of the ports, the device can access the memory cells 100 through the other port. As a result, this memory device requires no apparent precharge interval and can perform read and write operations at a high speed.

Even a semiconductor memory device with these two ports also needs a refresh operation. Normally, the refresh operation should be performed while no memory cells are accessed (i.e., no data is read out or written from/on any memory cells). Thus, it has been necessary to design a system with the refresh timings taken into account or to suspend the data input/output operation for the refresh interval. As a result, the system might have had its configuration overly complicated. Furthermore, the refresh operation might also prevent the user from taking full advantage of the performance a chip originally has.

SUMMARY OF THE INVENTION

It is therefore an object of the present invention to enable a semiconductor memory device to transfer data continuously without stopping its read or write operation for the purpose of refreshing.

Specifically, a semiconductor memory device according to the present invention includes memory array, first and second rows of sense amplifiers and selector. The memory array has first and second ports. The first and second rows are associated with the first and second ports, respectively. Responsive to a port selection signal, the selector selects the first or second port to transfer burst data therethrough, and couples the first or second row, associated with the port selected, to a data input or output circuit. If the selector has selected the first port, the device performs a refresh operation on the memory array using the second row while transferring the burst data through the first port. On the other hand, if the selector has selected the second port, the device performs the refresh operation on the memory array using the first row while transferring the burst data through the second port.

According to the present invention, while the memory device is transferring burst data through one of the two ports, the device can perform a refresh operation using the other port. Thus, there is no need to stop the data transfer for the refreshing purposes and the burst data can be transferred continuously at a high speed.

In one embodiment of the present invention, the memory device preferably further includes a command generator for generating the port selection signal on receiving a read or write command. Then, every time the memory device receives a read or write command, the device can transfer the burst data through one of the two ports that has just gone through the refresh operation.

In this particular embodiment, the memory device preferably further includes a refresh timer and a refresh control circuit. The refresh timer preferably outputs a refresh request signal. On receiving the read or write command, the command generator preferably generates a command detection signal. In response to the refresh request signal and the command detection signal, the refresh control circuit preferably generates a refresh command to refresh the memory array. Then, there is no need to control the refresh timings externally.

Specifically, the refresh control circuit preferably includes means for setting a refresh enabled interval and a refresh controller. The setting means generates a refresh enable signal, indicating an interval during which the refresh operation is enabled, in response to the command detection signal. The refresh controller generates the refresh command in response to the refresh enable signal and the refresh request signal. Then, no refresh commands will be generated in an interval in which the refresh operation is disabled.

In this case, the memory device preferably transfers the burst data of a predetermined burst length through either the first or second port selected on receiving the read or write command.

More specifically, the setting means preferably includes a counter and a decoder. Preferably, the counter is reset responsive to the command detection signal, counts the number of clock pulses applied to control the operation of the semiconductor memory device and outputs the number as a count. When the count reaches a predetermined value, the decoder preferably asserts and outputs the refresh enable signal. In such an embodiment, it is possible to control the refresh timing appropriately and synchronously with a clock pulse.

In still another embodiment, the refresh control circuit preferably further includes a latch that latches the refresh request signal and then outputs it to the refresh controller. The output of the latch is preferably cleared in response to the refresh command.

In yet another embodiment, the memory array preferably includes a plurality of memory cells and first and second groups of bit lines. Each of the memory cells preferably includes a capacitor for storing data thereon and first and second transistors. The first and second transistors preferably have their source connected to one electrode of the capacitor. Each said bit line of the first group preferably couples drains of the first transistors, included in associated ones of the memory cells, to the first row of sense amplifiers. Each said bit line of the second group preferably couples drains of the second transistors, included in associated ones of the memory cells, to the second row of sense amplifiers.

DESCRIPTION OF THE PREFERRED EMBODIMENTS

Hereinafter, preferred embodiments of the present invention will be described with reference to the accompanying drawings.

Figure 1:
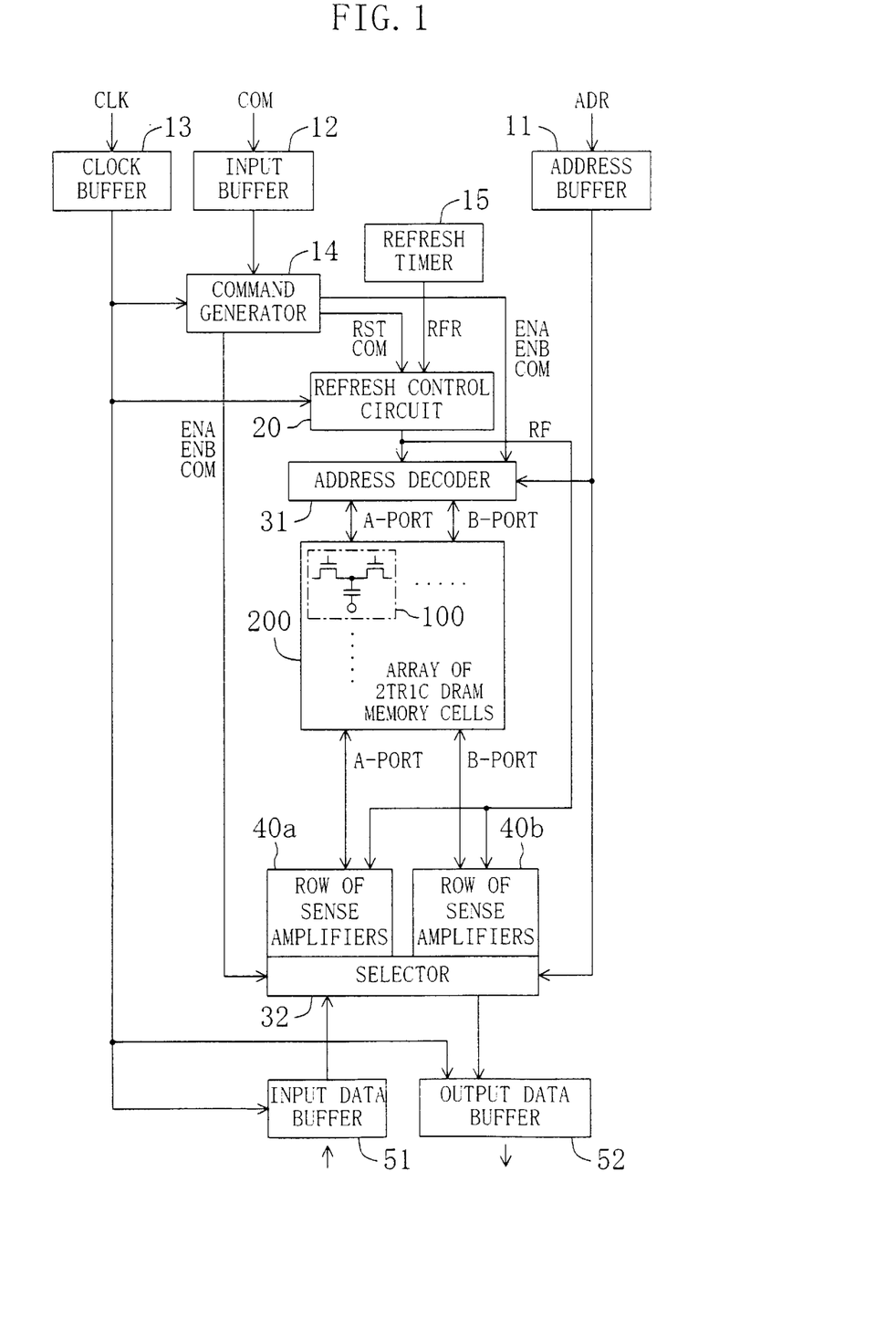
FIG. 1 is a block diagram illustrating a semiconductor memory device according to an embodiment of the present invention.

FIG. 1 is a block diagram illustrating a semiconductor memory device according to an embodiment of the present invention. As shown in FIG. 1, the memory device includes address buffer 11, input buffer 12, clock buffer 13, command generator 14, refresh timer 15, refresh control circuit 20, address decoder 31, selector 32, first and second rows 40a and 40b of sense amplifiers, memory array 200 and input and output data buffers 51 and 52. The memory array 200 includes a plurality of 2Tr1C DRAM memory cells 100.

FIG. 2 is a circuit diagram illustrating the memory array 200 and its peripheral circuits for the memory device shown in FIG. 1. As shown in FIG. 2, one of the memory cells 100 includes first and second transistors 101a and 101b and a capacitor 102. In the memory cell 100, the first transistor 101a has its gate, drain and source connected to first word line WL1a, first bit line BL1a and storage node SN, respectively. The second transistor 101b has its gate, drain and source connected to second word line WL1b, second bit line BL1b and storage node SN, respectively. One of the two electrodes of the capacitor 102 is connected to the storage node SN, while the other electrode thereof is used as a cell plate. Although not specifically identified by the respective reference numerals, each of the other memory cells 100 also has the two transistors and one capacitor and is also connected to associated two word lines and associated two bit lines.

The first and second bit lines BL1a and BL1b are connected to sense amplifiers 41a and 41b, respectively. The other first bit lines BL2a, BL3a, BL4a, etc. are connected to sense amplifiers 42a, 43a, 44a, etc. The other second bit lines BL2b, BL3b, BL4b, etc. are connected to sense amplifiers 42b, 43b, 44b, etc. The first row 40a includes the sense amplifiers 41a, 42a, 43a, 44a, etc., while the second row 40b includes the sense amplifiers 41b, 42b, 43b, 44b, etc.

Each of these memory cells 100 can be accessed through one of A- and B-ports. As used herein, the A-port includes the first word lines WL1a, WL2a, etc., first transistors 101a, first bit lines BL1a, BL2a, etc. and first row 40a of sense amplifiers. The B-port is herein supposed to include the second word lines WL1b, WL2b, etc., second transistors 101b, second bit lines BL1b, BL2b, etc. and second row 40b of sense amplifiers. That is to say, the memory array 200 is so constructed that one of the memory cells 100 to be activated is selected through the A- or B-port and that data is input or output through the A- or B-port. Also, "burst data transfer" herein means burst data read or burst data write.

Furthermore, an interval in which the refresh control circuit 20 must not output any refresh command RF, i.e., an interval in which the start of a refresh operation is prohibited, will be herein called a "refresh disabled interval". The intervals other than the refresh disabled intervals will be herein regarded as "refresh enabled intervals". During a refresh enabled interval, the refresh control circuit 20 may output a refresh command RF.

As shown in FIG. 1, an address ADR is input to the address decoder 31 and selector 32 by way of the address buffer 11. A command COM is input through the input buffer 12 to the command generator 14. A clock signal CLK is input via the clock buffer 13 to the command generator 14, refresh control circuit 20 and input and output data buffers 51 and 52.

The command generator 14 outputs port selection signals ENA and ENB and command COM to the address decoder 31 and selector 32. The port selection signals ENA and ENB have mutually opposite signal levels. That is to say, while one of the port selection signals ENA or ENB has a high potential level representing logical one state, the other signal ENB or ENA should have a low potential level representing logical zero state. These high and low potential levels will be herein called "H-level" and "L-level", respectively. On receiving a read or write command COM, the command generator 14 inverts the levels of the port selection signals ENA and ENB and then outputs those inverted signals. Also, responsive to the command COM, the command generator 14 outputs a reset signal RST (command detection signal) and the command COM to the refresh control circuit 20.

At regular refresh intervals as required for the memory cells 100, the refresh timer 15 outputs a refresh request signal RFR to the refresh control circuit 20.

The refresh control circuit 20 outputs the refresh command RF to the address decoder 31 and first and second rows 40a and 40b of sense amplifiers if no commands are input (i.e., while the memory device is in NO OPERATION mode) at a point in time within a refresh enabled interval after the refresh request signal RFR has been input. The refresh enabled interval is defined in accordance with the reset signal RST (command detection signal). The refresh command RF is output synchronously with a rise of the clock signal CLK. In response to the refresh command RF, the address decoder 31 and first and second rows 40a and 40b of sense amplifiers start to perform a refresh operation on the memory cells 100 to be refreshed.

Suppose the memory device shown in FIG. 1 is now transferring burst data. Then, the "refresh enabled interval" should be of such a length as getting a refresh operation, which was started responsive to the refresh command RF during the refresh enabled interval, done within the burst data transfer interval. So the refresh enabled interval has its length defined beforehand in accordance with the burst length of the burst data to be transferred. On the other hand, while the memory device shown in FIG. 1 is currently in standby mode (i.e., not performing read or write operation), no special timing control is needed, so refreshing is enabled at any time during that interval.

The address decoder 31 activates one of the two word lines (e.g., WL1a and WL1b) that have been specified by the address ADR input, thereby getting the memory cells 100 in the memory array 200 ready to read, write or refresh. The word line to be activated should belong to the A- or B-port that has been specified by the port selection signals ENA and ENB.

The selector 32 selects one of the two bit lines (e.g., BL1a and BL1b) that have been specified by the address ADR input. The bit line to be selected should also belong to the A- or B-port that has been specified by the port selection signals ENA and ENB. Then, the first or second row 40a or 40b of sense amplifiers reads or writes the memory cell 100 connected to the bit line selected.

The input data buffer 51 outputs the input data to the selector 32, while the output data buffer 52 delivers the output data of the selector 32, i.e., the data read out from the memory cell 100. While burst data should be transferred, the selector 32 inputs or outputs the data consecutively by way of the input or output data buffer 51 or 52.

In other words, responsive to the port selection signals ENA and ENB, the selector 32 selects the A- or B-port, through which the burst data should be transferred, and couples the first or second row 40a or 40b of sense amplifiers, associated with the port selected, to the input or output data buffer 51 or 52.

Figure 3:
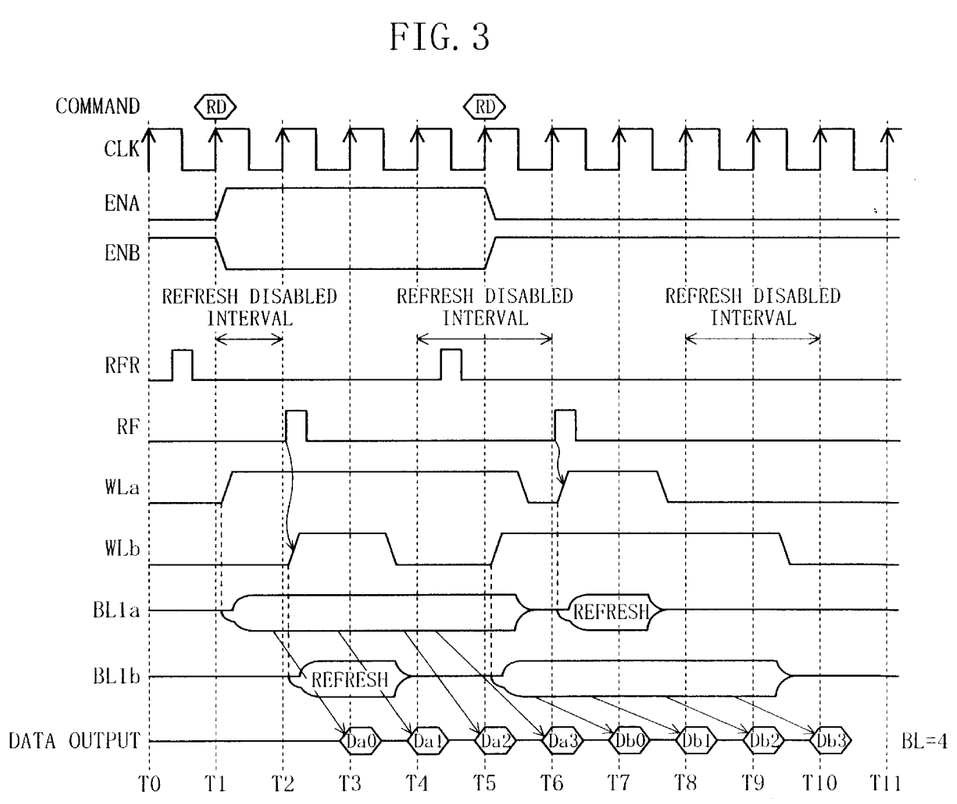
FIG. 3 is a timing diagram illustrating how the memory device shown in FIG. 1 reads burst data and performs refreshing in parallel.

FIG. 3 is a timing diagram illustrating how the memory device shown in FIG. 1 reads burst data and performs refreshing in parallel. Hereinafter, it will be described with reference to FIGS. 1 and 3 how the memory device shown in FIG. 1 operates.

In the following illustrative example, while the port selection signals ENA and ENB are at H- and L-levels, respectively, the memory device will perform a read or write operation through the A-port and a refresh operation through the B-port, respectively. On the other hand, while the port selection signals ENA and ENB are at L- and H-levels, respectively, the memory device will perform a refresh operation through the A-port and a read or write operation through the B-port, respectively.

Also, in the following example, one pulse period of the clock signal CLK will be called a "clock cycle". The address will be input by a non-multiplexer method, and the data will be input or output by a burst data transfer method. The burst length is supposed to be 4. A random-access cycle comprises 4 clock cycles. And a refresh operation should require 2 clock cycles. The refresh disabled intervals illustrated in FIG. 3 are defined where the burst length is 4. Also, in FIG. 3, the respective signal levels of multiple first word lines are superposed one upon the other. So. the levels of the word line WLa shown in FIG. 3 represent H levels of multiple signals passing through multiple first word lines. The same statement is also applicable to the respective levels of the second word line WL1b.

In the interval between times T0 and T1, the refresh timer 15 outputs the refresh request signal RFR. Also, in this interval, a read command RD is externally input as a command COM through the input buffer 12 to the command generator 14.

At the time T1, the clock signal CLK rises just after the read command RD has been input to the command generator 14. At the same time, the command generator 14 asserts and negates the port selection signals ENA and ENB to H- and L-levels, respectively. The address decoder 31 activates one (e.g., WL1a) of the first word lines WLa that has been specified by the address ADR input, thereby starting to read out the burst data through the first bit lines BL1a, BL3a, etc. That is to say, a read operation using the A-port is started. Since the burst length is 4 in this example, the burst read operation will be performed until a point in time between times T5 and T6. The output data buffer 52 will output the read data Da0 through Da3 between times T3 and T7.

To finish a refresh operation and accept the next command input within the burst data transfer interval that started responsive to the read command RD input between the times T0 and T1, the refresh operation should start and end sometime between times T2 and T5. Accordingly, the interval between the times T1 and T2 is a refresh disabled interval in which the refresh control circuit 20 cannot output any refresh command RF.

The refresh control circuit 20 outputs a refresh command RF synchronously with a rise of the clock signal CLK. Since a refresh operation requires 2 clock cycles in this example, the refresh control circuit 20 has to output a refresh command RF at the time T2 or T3. Accordingly, in this case, the interval between the times T2 and T4 is a refresh enabled interval, while the interval between the times T4 and T5 is a refresh disabled interval.

The refresh enabled interval starts at the time T2. Accordingly, the refresh control circuit 20 outputs the refresh command RF. In the interval between the times T2 and T4, the address decoder 31 activates one (e.g., WL1b) of the second word lines WLb that are not used for reading, while the second row 40b of sense amplifiers performs a refresh operation for re-storing data using the second bit lines BL1b, BL3b, etc. That is to say, the refresh operation is performed using the B-port. At the time T5, the B-port has already finished the refresh operation and is now in standby mode. Thus, the B-port is ready to start any operation in accordance with the command COM to be input next time.

The refresh timer 15 outputs the refresh request signal RFR again in the interval between the times T4 and T5. However, the interval between the times T4 and T5 is a refresh disabled interval, and the refresh control circuit 20 outputs no refresh command RF.

Another read command RD is input to the command generator 14 just before the time T5. Then, at the time T5, the command generator 14 negates and asserts the port selection signals ENA and ENB to L- and H-levels, respectively. The address decoder 31 activates one (e.g., WL1b) of the second word lines WLb that has been specified by the address ADR input, thereby starting to read out the burst data through the second bit lines BL1b, BL3b, etc. That is to say, a read operation using the B-port is started. The output data buffer 52 will output the read data Db0 through Db3 between times T7 and T11.

Because of the same reasons, the interval between the times T5 and T6 and the interval between the times T8 and T10 are refresh disabled intervals, while the interval between the times T6 and T8 is a refresh enabled interval.

The refresh enabled interval starts at the time T6. Accordingly, the refresh control circuit 20 outputs a refresh command RF. In the interval between the times T6 and T8, the address decoder 31 activates one (e.g., WL1a) of the first word lines WLa that are not used for reading, while the first row 40a performs a refresh operation for re-storing data using the first bit lines BL1a, BL3a, etc. That is to say, the refresh operation is performed using the A-port. At the time T9, the A-port has already finished the refresh operation and is now in standby mode.

Figure 4:
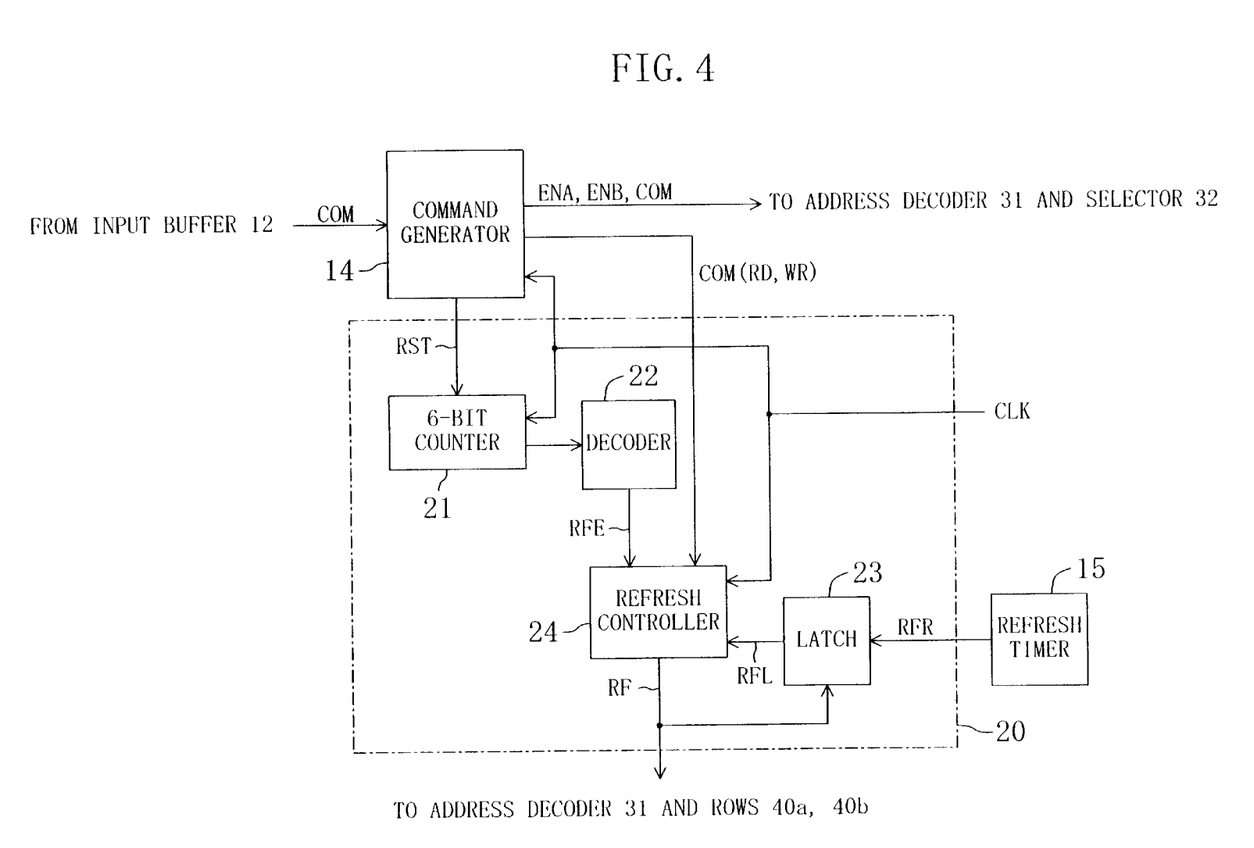
FIG. 4 is a block diagram illustrating a configuration for the refresh control circuit shown in FIG. 1.

FIG. 4 is a block diagram illustrating a configuration for the refresh control circuit shown in FIG. 1. As shown in FIG. 4, the refresh control circuit 20 includes 6-bit counter 21, decoder 22, latch 23 and refresh controller 24. The clock signal CLK is input to the command generator 14, counter 21 and refresh controller 24. The counter 21 and decoder 22 together sets a refresh enable interval.

When a command COM is externally input to the command generator 14 by way of the input buffer 12, the command generator 14 outputs a reset signal RST to the counter 21 and the command COM to the refresh controller 24, respectively. At the same time, the command generator 14 inverts the levels of the port selection signals ENA and ENB and outputs these inverted signals, along with the command COM, to the address decoder 31 and selector 32.

Every time the clock signal CLK rises, the counter 21 increments its count. And responsive to the reset signal RST, the counter 21 resets its count to zero. On and after its count reaches five, the counter 21 will retain this count "5" until the reset signal RST is input next time.

The decoder 22 outputs a refresh enable signal RFE to the refresh controller 24. In accordance with the count of the counter 21, the decoder 22 changes the level of the refresh enable signal RFE. In the illustrated example, if the count of the counter 21 is "2" or "3", the decoder 22 is supposed to negate the refresh enable signal RFE to L-level. On the other hand, if the count of the counter 21 is "0", "1", "4" or "5", the decoder 22 is supposed to assert the refresh enable signal RFE to H-level.

An H-level refresh enable signal RFE represents that one cycle starting at the next leading edge of the clock signal CLK can be a refresh enabled interval. If neither read nor write command RD nor WR is input (i.e., if the memory device is in NO OPERATION mode) and if the refresh enable signal RFE is high when the clock signal CLK rises the next time, one cycle starting at the leading edge of the clock signal CLK will be a refresh enabled interval.

The latch 23 outputs a refresh request latched signal RFL to the refresh controller 24. In response to the refresh request signal RFR output from the refresh timer 15, the latch 23 asserts the refresh request latched signal RFL to H-level. On the other hand, when the refresh controller 24 outputs the refresh command RF to the latch 23, the latch 23 negates the refresh request latched signal RFL to L-level.

When the clock signal CLK rises while the refresh enable and refresh request latched signals RFE and RFL are both high and neither read nor write command RD nor WR is input as the command COM (i.e., while the memory device is in NO OPERATION mode), the refresh controller 24 outputs the refresh command RF to the latch 23, address decoder 31 and first and second rows 40a and 40b of sense amplifiers.

Figure 5:
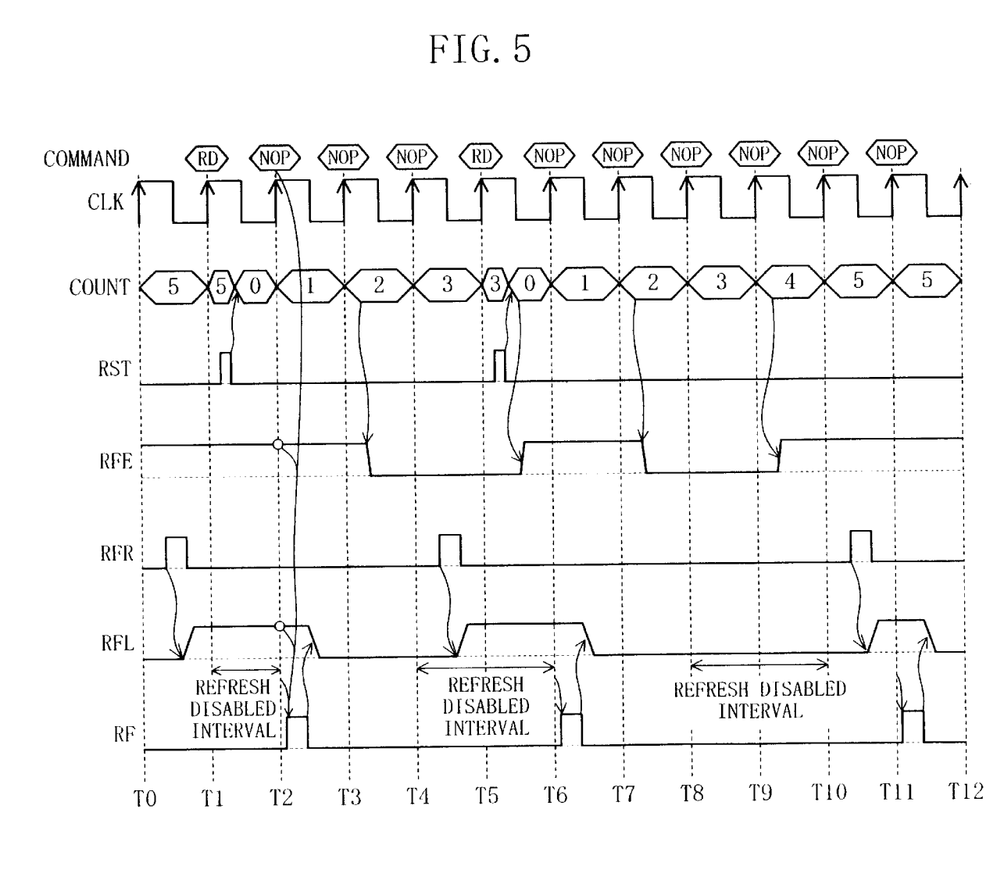
FIG. 5 is a timing diagram illustrating how the refresh control circuit may operate.

FIG. 5 is a timing diagram illustrating how the refresh control circuit 20 may operate. In FIG. 5, the times T0 through T11 are the same as the counterparts shown in FIG. 3. Hereinafter, it will be described how the refresh control circuit 20 operates where a read command RD has been externally input as a command COM. Also, in FIG. 5, NOP indicates that neither read nor write command RD nor WR is being input as the command COM.

In the interval between times T0 and T1, the refresh timer 15 outputs a refresh request signal RFR and the latch 23 asserts the refresh request latched signal RFL to H-level. Also, in this interval between the times T0 and T1, a read command RD is externally input to the command generator 14 by way of the input buffer 12. In response, the command generator 14 outputs a reset signal RST to the counter 21 in the interval between the times T1 and T2, thereby resetting the count of the counter 21 to zero.

At the time T1, the clock signal CLK rises. Although the refresh request latched signal RFL is high at this time Ti, the refresh controller 24 outputs no refresh command RF because the read command RD has just been input.

Next, at the time T2, the clock signal CLK rises again. At this time T2, the refresh enable and refresh request latched signals RFE and RFL are both high and the command input COM is NOP. Accordingly, the refresh controller 24 outputs the refresh command RF. In response, a refresh operation is started using the A- or B-port that is not used for reading. On receiving the refresh command RF, the latch 23 negates the refresh request latched signal RFL to L-level. Also, at this time T2, the counter 21 increments its count to "1".

Then, at the time T3, the clock signal CLK rises the next time to increase the count of the counter 21 to "2". In response, the decoder 22 negates the refresh enable signal RFE to L-level.

Subsequently, at the time T4, the clock signal CLK rises the next time to increase the count of the counter 21 to "3".

In the interval between the times T4 and T5, the refresh timer 15 outputs the refresh request signal RFR and the latch 23 asserts the refresh request latched signal RFL to H-level.

Also, in this interval between the times T4 and T5, another read command RD is externally input to the command generator 14 by way of the input buffer 12. In response, the command generator 14 outputs the reset signal RST to the counter 21 in the interval between the times T5 and T6, thereby resetting the counter 21.

At the time T5, the refresh request latched signal RFL is high, but the refresh enable signal RFE is low. Thus, the refresh controller 24 outputs no refresh command RF. In the interval between the times T5 and T6, the counter 21 is reset to zero. In response, the decoder 22 asserts the refresh enable signal RFE to H-level.

Next, at the time T6, the clock signal CLK rises again. At this time T6, the refresh enable and refresh request latched signals RFE and RFL are both high and the command COM input is NOP. Accordingly, the refresh controller 24 outputs the refresh command RF. In response, a refresh operation is started using one of the two ports that is not used for reading in the same way as the time T2.

At the times T7, T8, T9 and T10, the counter 21 increments its count to "2", "3", "4" and "5", respectively. Thereafter, so long as the memory device is in standby mode and performing neither reading nor writing, the counter 21 will retain its count at "5". Accordingly, the decoder 22 will keep the refresh enable signal RFE high. Thus, if the refresh timer 15 outputs the refresh request signal RFR in the interval between the times T10 and T11, the refresh controller 24 will output the refresh command RF at the time T11 when the clock signal CLK rises the next time.

As can be seen, the refresh control circuit 20 shown in FIG. 4 changes the level of the refresh enable signal RFE in accordance with the count of the counter 21. Accordingly, it is possible to prevent the refresh control circuit 20 from outputting the refresh command RF in a refresh disabled interval, e.g., the interval between the times T1 and T2 shown in FIG. 3.

The 6-bit counter 21 may be replaced with a counter that can count the number of clock pulses to 6 or more. In that case, if the count is six or more, the decoder 22 may operate in the same way as the situation where the count is five in the foregoing example.

In this embodiment, the counter 21 and decoder 22 together sets a refresh enabled interval. However, any other circuits may be used instead so long as the refresh enable signal can be generated in some way or other.

Also, in the foregoing embodiment, read commands RD are supposed to be input as the commands COM. However, the same statement is applicable to a situation where write commands WR are input.

As described above, while the memory device of this embodiment is transferring burst data using either the first bit lines BL1a, BL3a, etc. belonging to the A-port or the second bit lines BL1b, BL3b, etc. belonging to the B-port, the device can perform refreshing using the first or second bit lines that are not used for the burst data transfer. Accordingly, there is no need to stop the read or write operation to start the refresh operation and data can be transferred continuously. The data transfer does not have to be stopped for the precharging purpose, either.

In the foregoing illustrative embodiment, the present invention has been described as being applied to a semiconductor memory device including 2Tr1C memory cells. However, the present invention is equally applicable to any other semiconductor memory device if the device includes a memory array with two ports and two independent rows of sense amplifiers provided for these ports.

Also, in the foregoing description, the inventive memory device includes a refresh control circuit for controlling the refresh operation. Alternatively, the refresh timings may be directly controlled using externally input commands. In that case, the circuit configuration can be simplified.

Moreover, in the foregoing embodiments, the command generator 14 outputs the port selection signals ENA and ENB to select a port for use in the refresh operation. However, the port selection signals may be input externally or the address decoder 31 and selector 32 may select the port for the refresh operation.

Furthermore, in the foregoing embodiment, the refresh command RF is supposed to be output synchronously with a rise of the clock signal CLK. Alternatively, to afford some timing margin, the refresh command RF may be output after having been delayed by a half clock cycle time.

As is apparent from the foregoing description, the memory device of the present invention does not have to stop burst data transfer to start a refresh operation and includes a circuit for controlling the refresh operation. Accordingly, a semiconductor memory device requiring no externally input refresh commands is realized.

What is claimed is:

1. A semiconductor memory device comprising:
    a memory array having first and second ports;
    a first row of sense amplifiers, which is associated with the first port;
    a second row of sense amplifiers, which is associated with the second port;
    a selector for selecting either the first or second port, through which burst data should be transferred, responsive to a port selection signal, the selector coupling either the first or second row of sense amplifiers, which is associated with the selected one of the first and second ports, to a data input circuit or a data output circuit; and
    a refresh control circuit for providing a refresh command to the first and second rows of sense amplifiers,
    wherein if the selector has selected the first port, a refresh operation on the memory array is performed in response to the refresh command using the second row of sense amplifiers, and
    wherein if the selector has selected the second port, the refresh operation on the memory array is performed in response to the refresh-command using the first row of sense amplifiers.

2. The device of claim 1, further comprising a command generator for generating the port selection signal on receiving a read or write command.

3. The device of claim 2, further comprising:
    a refresh timer for outputting a refresh request signal,
    wherein on receiving the read or write command, the command generator generates a command detection signal, and
    wherein in response to the refresh request signal and the command detection signal, the refresh control circuit generates the refresh command to refresh the memory array.

4. The device of claim 3, wherein the refresh control circuit comprises:
    means for setting a refresh enabled interval by generating a refresh enable signal, indicating an interval during which the refresh operation is enabled, in response to the command detection signal; and
    a refresh controller for generating the refresh command in response to the refresh enable signal and the refresh request signal.

5. The device of claim 4, which transfers the burst data of a predetermined burst length through either the first or second port selected on receiving the read or write command.

6. The device of claim 5, wherein the setting means comprises:
- a counter, which is reset responsive to the command detection signal, counts the number of clock pulses applied to control the operation of the semiconductor memory device and outputs the number as a count; and
- a decoder for asserting and outputting the refresh enable signal when the count reaches a predetermined value.

7. The device of claim 4, wherein the refresh control circuit further comprises a latch that latches the refresh request signal and then outputs the refresh request signal to the refresh controller, the output of the latch being cleared in response to the refresh command.

8. The device of claim 1, wherein the memory array comprises:
- a plurality of memory cells, each including a capacitor for storing data thereon and first and second transistors, wherein the first and second transistors have their source connected to an electrode of the capacitor;
- a first group of bit lines, each said bit line of the first group coupling drains of the first transistors, included in associated ones of the memory cells, to the first row of sense amplifiers; and
- a second group of bit lines, each said bit line of the second group coupling drains of the second transistors, included in associated ones of the memory cells, to the second row of sense amplifiers.

* * * * *